(12) United States Patent
Barkley

(10) Patent No.: US 7,623,373 B2
(45) Date of Patent: Nov. 24, 2009

(54) MULTI-LEVEL MEMORY CELL SENSING

(75) Inventor: Gerald Barkley, Oregon, WI (US)

(73) Assignee: Intel Corporation, Santa Clara, CA (US)

( * ) Notice: Subject to any disclaimer, the term of this patent is extended or adjusted under 35 U.S.C. 154(b) by 1 day.

(21) Appl. No.: 11/639,092

(22) Filed: Dec. 14, 2006

(65) Prior Publication Data

US 2008/0144369 A1    Jun. 19, 2008

(51) Int. Cl.
*G11C 16/04* (2006.01)

(52) U.S. Cl. .......................... 365/185.03; 365/185.13; 365/185.21; 365/189.09

(58) Field of Classification Search ............ 365/185.03, 365/185.13, 182.21, 189.09
See application file for complete search history.

(56) References Cited

U.S. PATENT DOCUMENTS

| | | | | |
|---|---|---|---|---|
| 5,265,052 A | * | 11/1993 | D'Arrigo et al. | 365/185.23 |
| 5,687,352 A | * | 11/1997 | Beat | 711/154 |
| 5,889,698 A | * | 3/1999 | Miwa et al. | 365/185.03 |
| 6,801,452 B2 | * | 10/2004 | Miwa et al. | 365/185.03 |
| 2006/0028898 A1 | * | 2/2006 | Sibigtroth et al. | 365/230.03 |
| 2006/0221758 A1 | * | 10/2006 | Petti et al. | 365/230.06 |
| 2007/0008780 A1 | * | 1/2007 | Jung et al. | 365/185.23 |
| 2007/0047300 A1 | * | 3/2007 | Lee et al. | 365/185.03 |
| 2007/0070745 A1 | * | 3/2007 | Versen et al. | 365/203 |
| 2007/0171708 A1 | * | 7/2007 | Tedrow et al. | 365/185.03 |

OTHER PUBLICATIONS

Tedrow et al., "Multi-Level Memory Cell Sensing", U.S. Appl. No. 11/320,529, filed Dec. 28, 2005.

* cited by examiner

*Primary Examiner*—Thong Q Le
(74) *Attorney, Agent, or Firm*—Trop, Pruner & Hu, P.C.

(57) ABSTRACT

The delay arising from wordline capacitance in multi-level memories may be reduced by adding switched transistors along the wordline path. Also, the wordline may be pre-charged to a high level and then the first wordline voltage level for reading may be a center level. The switched transistors may be p-devices whose n-wells are biased by a stable DC voltage. Nodes along the wordline may float when not accessed. Finally, a distributed voltage generator may be used.

23 Claims, 8 Drawing Sheets

MULTI-LEVEL MEMORY CELL SENSING

BACKGROUND

This relates generally to memory devices and, more specifically, to memory devices with multi-level cells.

Memory devices store digital information. As technology advances, memory devices are able store increasingly large amounts of information. Historically, information density in memories has increased through reductions in device sizes and increases in integration. Information density may also be increased by storing more than one bit of information in each memory "cell."

DETAILED DESCRIPTION

Figure 1:
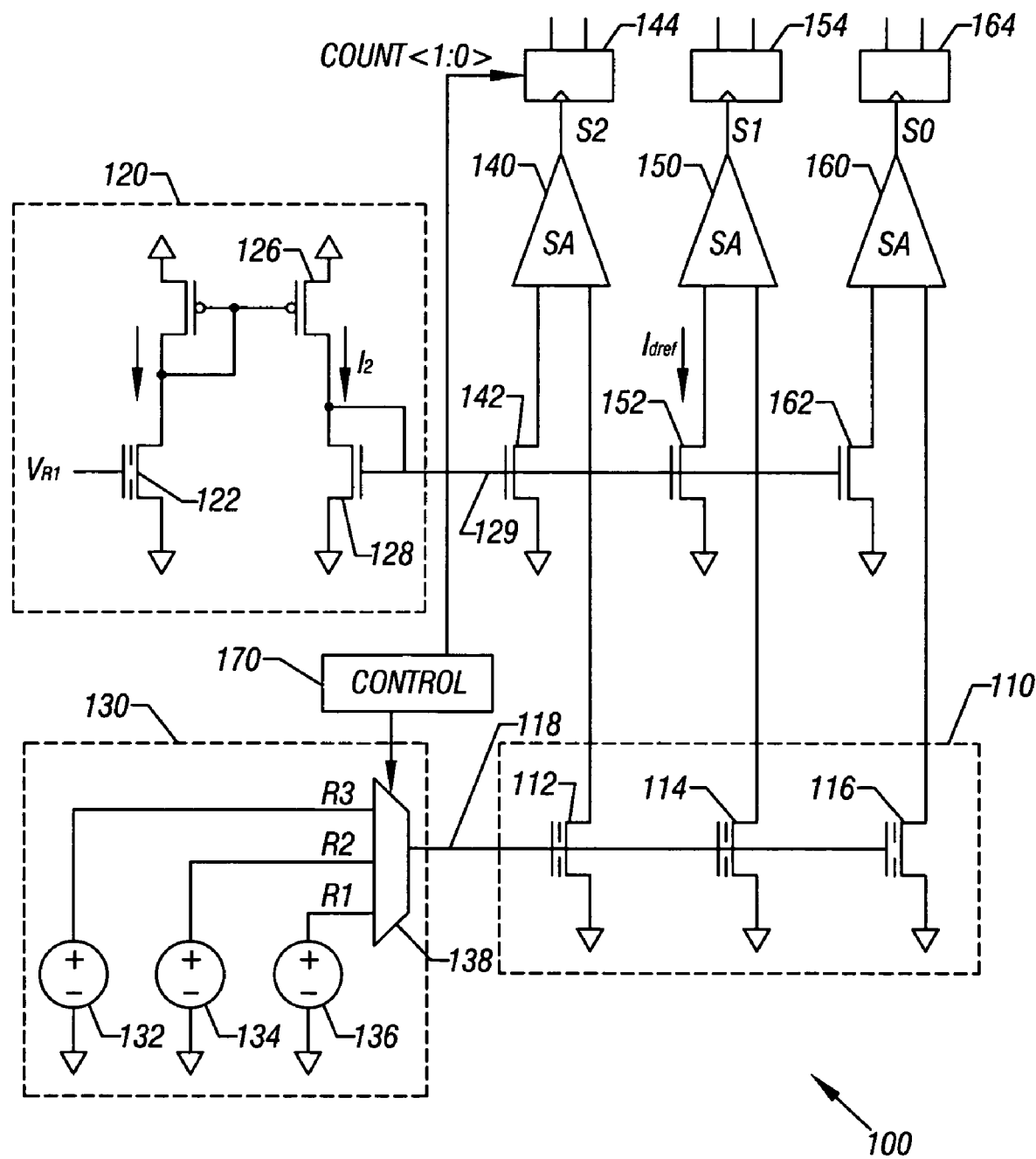
FIG. 1 shows a multi-level cell memory device.

FIG. 1 shows a multi-level cell memory device. Memory device 100 includes memory array 110, reference current generator 120, stepped voltage generator 130, sense amplifiers 140, 150, and 160, current mirror transistors 142, 152, and 162, latches 144, 154, and 164, and control circuit 170.

Memory array 110 includes multi-level cell transistors 112, 114, and 116 having gate nodes coupled to wordline 118. Transistors 112, 114, and 116, capable of storing multiple bits of information, may be "programmed" to have different threshold voltages. For example, the transistors 112, 114, and 116 may be "FLASH" cells that have floating gates capable of storing charge. The threshold voltage of a programmed flash cell depends in part on the amount of charge stored on the floating gate. By varying the amount of charged stored, transistors 112, 114, and 116 may be programmed to one of many different levels. For example, transistors 112, 114, and 116 may each be programmed to one of four levels to effectively store two bits of information in each memory cell.

Although this description focuses on embodiments in which each multi-level cell is programmed to one of four levels, the various embodiments of the invention are not so limited. For example, in some embodiments of the present invention, each multi-level cell may be programmed to one of eight levels or one of 16 levels.

For simplicity, FIG. 1 shows one row of cells in the array 110. In some embodiments, the array includes many rows and columns of cells. Further, in some embodiments, arrays are arranged in blocks, and many blocks are included within memory device 100. The memory array may include planes that, in one embodiment, include 16 blocks of cells. A partition includes two planes, in one embodiment. Memory device 100 may be any size with any hierarchical arrangement without departing from the scope of the present invention.

The cell state is determined by performing multiple comparisons of the cell drain current to a fixed reference current where the cell gate voltage is varied for each comparison. For an N-state memory, N-1 comparisons with N-1 gate voltage values are used to uniquely determine the cell state.

Stepped voltage generator 130 sources the N-1 gate voltage values, where N is equal to 4 in one embodiment. The N-1 gate voltage values may be fixed and generated using ideal on-chip voltage reference circuits 132, 134, and 136, which may be independent of environmental conditions. A timing control circuit 170 may generate control signals to control multiplexer 138. Multiplexer 138 selects one of the N-1 gate voltage values to be applied to the wordline. In some embodiments, the gate voltage sequences from high values to low values (step down). In other embodiments, the gate voltage sequences from low to high (step up). In still further embodiments, the sequence of gate voltages is arbitrary. For example, for a multi-level cell having four possible states, the gate may be driven with three voltage values in sequence starting with the center value, then proceeding to the low value, and then the high value.

In spiral sensing, the wordline is pre-charged to the high level. The voltage is allowed to fall to the center value which is sensed first, followed by the low value, and then the high value. By going to the center value first, more gate drive is applied to the devices in the word line path, allowing faster transitions. Also, the center level may be read first to determine if the data stored in the selected row is single bit or multilevel data. If it is single bit data, the transition to the single bit level may be faster compared to starting with the low level.

Sense amplifiers 140, 150, and 160 compare currents in array cells to a reference current. For example, sense amplifier 140 may compare a drain current in transistor 112 to a reference drain current in transistor 142. The output of the sense amplifier is a digital signal representing the result of the comparison. This comparison result is converted to a binary representation of the cell state by logically combining the comparison result with a digital count that represents the cell state being compared against.

Various methods can be used to perform this state determination. In some embodiments, one or several latches are coupled to each amplifier to latch the state value. An example embodiment is shown in FIG. 1 with latches 144, 154, and 164 receiving a "count" value from control circuit 170, and a clock signal from the associated sense amplifier. When the sense amplifier output changes state, the count value that represents the cell state is latched.

As shown in FIG. 1, multiple sense amplifiers are included, where each sense amplifier is connected to a unique bitline. This allows many cells to be read simultaneously to increase the data throughput. All cells being read may simultaneously receive a common gate voltage applied through the wordline.

For program and erase operations, it may be desirable to position the cell levels halfway between the state boundaries used for read. This can provide high reliability for subsequent read operations. This state positioning may be accomplished by incorporating a special read mode, called verify mode, into the program and erase operations. This mode may be used to verify that the cell state is correctly positioned. The verify mode gate voltage values are intentionally offset from the read mode voltages to achieve the desired state positioning. It may also be desirable for verify mode to use the same gate voltage timing and sequence as used during read mode so that transient offsets in the gate path will be common to both verify and read, thus being cancelled.

Reference current generator 120 includes reference cell 122, which in some embodiments, is identical to array cells. For example, reference cell 122 may be identical to cell transistors 112, 114, and 116. The threshold voltage values of reference cell 122 may be adjusted during manufacturing or testing to achieve the desired nominal reference current. The gate voltage of the reference cell can be ideal (independent of environment). In some embodiments, a separate reference current generator 120 is provided for each sense amplifier.

In embodiments represented by FIG. 1, a current mirror is used to propagate the current of a single reference cell to each of the sense amplifiers. For example, the current in reference cell 122 ($I_1$) is mirrored to transistors 126 and 128 as $I_2$, which is in turn mirrored to transistors 142, 152, and 162 as $I_{dref}$. Transistor scaling techniques may be employed to provide fixed relationships between currents $I_1$, $I_2$, and $I_{dref}$.

In some embodiments, reference cell 122 is replaced by many cells whose drain currents are averaged to generate a current of an average reference cell. Also in some embodiments, the mirror gate voltage on node 129 is sampled and held on a large capacitor allowing the reference current generator to be turned off most of the time.

In embodiments having a temperature independent gate voltage on reference cell 122, the reference cell current is temperature-dependent due to the inherent temperature dependency of the cell. The reference current temperature dependency matches the temperature dependency of the main array cell which is also receiving a temperature independent gate voltage. This temperature tracking behavior ensures that the state difference obtained during verify is preserved during read, even if the temperature changes between verify and read operations.

Figure 2:
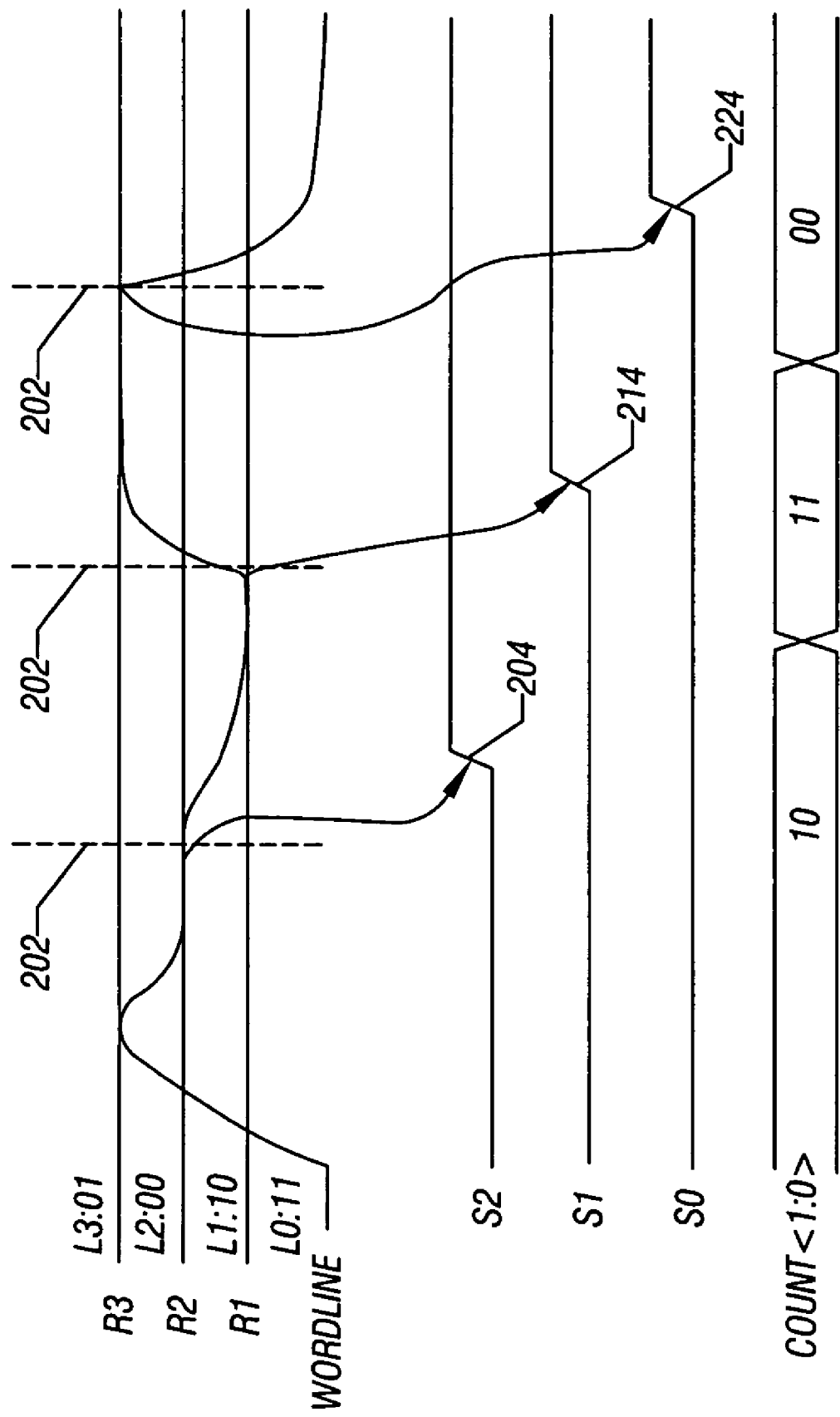
FIG. 2 shows waveforms corresponding to a read cycle of the memory device of FIG. 1.

FIG. 2 shows waveforms corresponding to a read cycle of the memory device of FIG. 1. The four levels L0, L1, L2, L3 represent the four possible states of the memory cell. The outputs S0, S1, S2, of the sense amplifiers are placed at a known state at the beginning of the sense operation. In embodiments represented by FIG. 2, the gate voltage of the memory cell (the wordline voltage) steps up or down through different cell levels to reference voltage values shown as R1, R2, and R3. As the wordline voltage ramps up, the state of the sense amplifier output changes at a point based on the threshold voltage of the flash cell. The point at which the sense amplifier output changes state is referred to as the "sense amplifier trip point." The gate voltage steps are synchronized with a counter, which counts the different data output states. As soon as the sense amplifier output changes state after sensing, the counter signal value is latched and determines the level of the flash cell.

In the example provided in FIG. 2, memory cell transistor 112 (FIG. 1) has a programmed threshold voltage in the L1 state, memory cell transistor 114 has a threshold voltage programmed in the L0 state, and memory cell transistor 116 has a programmed threshold voltage in the L2 state. As the wordline voltage is stepped up or down, each sense amplifier trips accordingly. For example, S2 trips at 204 as a result of the sense operation performed at 202, S1 trips at 214 as a result of the sense operation performed at 212, and S0 trips at 224 as a result of the sense operation at 222. S2, S, and S0 are used to latch the count value, so latch 144 stores a logic level of "10," latch 154 stores a logic level of "11," and latch 164 stores a logic level of "00." Any latches coupled to sense amplifiers that do not trip remain at their initialized state of "01," corresponding to the last level L3.

In some embodiments, the sense amplifiers sample the differential inputs at points 202, 212, and 222. After the bitlines are sampled, the wordline can start changing to the next level. With the sense amplifiers isolated from the memory cells, the sensing operation can complete in parallel with the wordline change for the next step. This background sensing while the wordline is ramping up may improve speed and performance in some cases.

Figure 3:
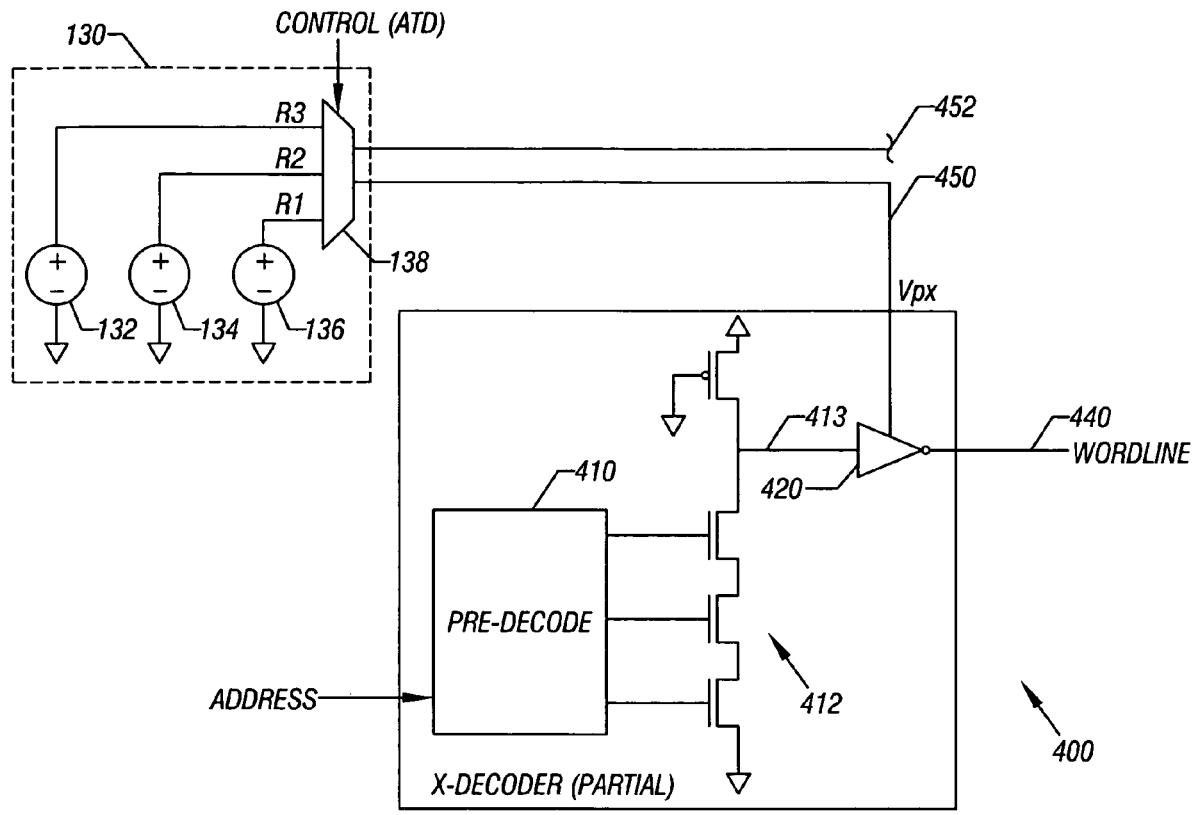
FIG. 3 shows a portion of an x-decoder coupled between a stepped voltage generator and a wordline.

FIG. 3 shows a portion of an x-decoder coupled between a stepped voltage generator and a wordline. X-decoder 400 decodes a portion of the address provided to the memory device, and selects a wordline. FIG. 3 shows a single wordline, but in some embodiments, x-decoder 400 can select one of many wordlines. Pre-decoder 410 receives address signals and drives signals at the input to NAND gate 412. When wordline 440 is to be selected, NAND gate 412 drives a low voltage on node 413 which drives output buffer 420. Output buffer 420 receives a voltage Vpx on a power supply node. Accordingly, when wordline 440 is selected, the power supply node voltage Vpx is driven onto wordline 440.

Figure 4:
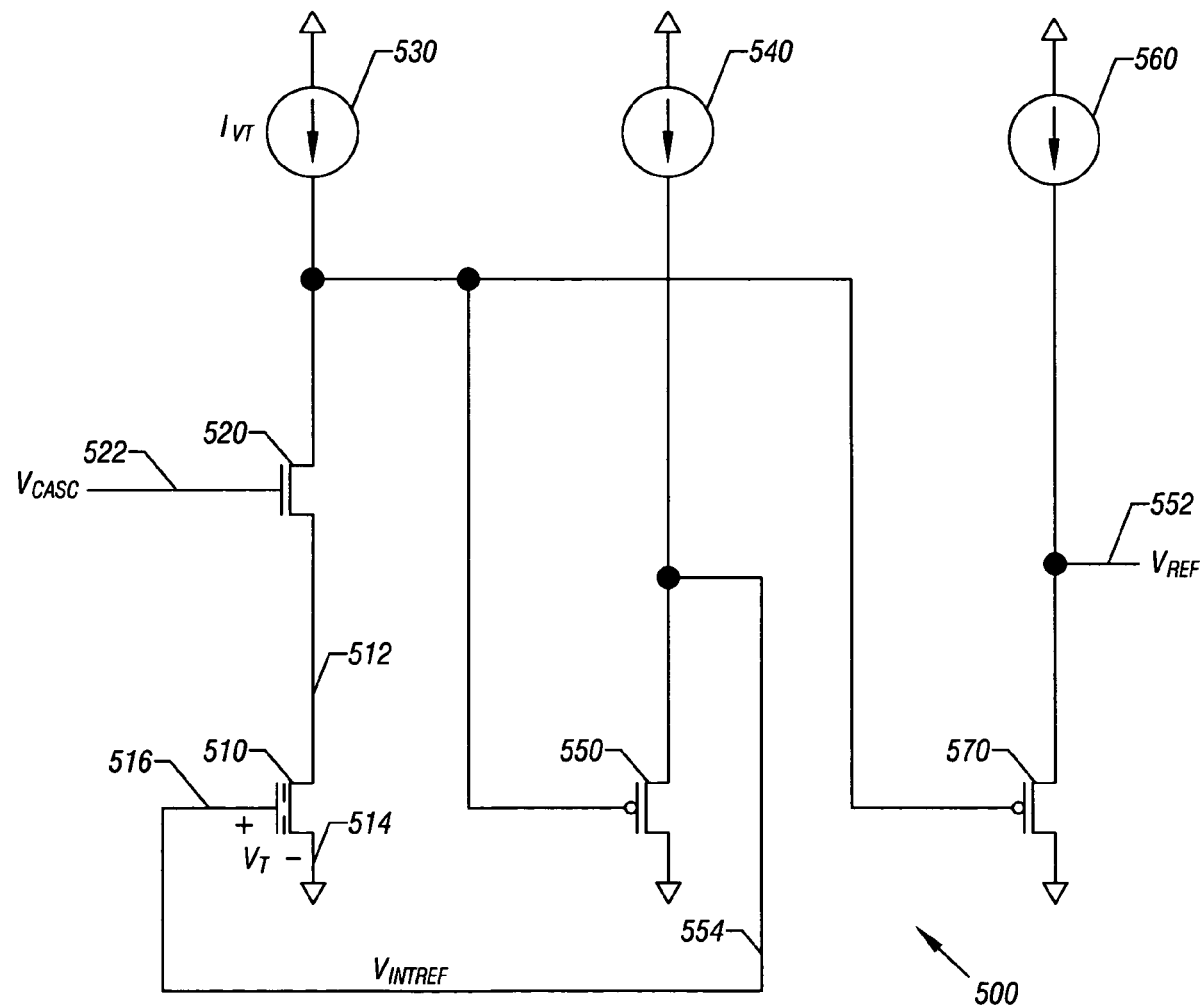
FIG. 4 shows a voltage reference circuit.

The voltage step up waveform is supplied as Vpx by stepped voltage generator 130. Referring now back to FIG. 1, wordline 118 is shown being driven directly by stepped voltage generator 130. FIG. 4 provides an example embodiment that shows how a wordline can be selected to be coupled to the stepped voltage generator. Voltage reference circuits 132, 134, and 136 may be implemented in many different ways.

FIG. 4 shows a voltage reference circuit. Voltage reference circuit 500 may be utilized within a stepped voltage generator used to source a wordline voltage. For example, voltage reference circuit 500 may be included in stepped voltage generator 130 (FIGS. 1, 3). Further, additional instantiations of voltage reference circuit 500 may be included in stepped voltage generator 130. In some embodiments, voltage reference circuit 500 is utilized as voltage reference circuit 136 to produce reference voltage level R1.

Voltage reference circuit 500 includes flash cell 510, transistors 520, 550, and 570, and current sources 530, 540, and 560. Flash cell 510, transistor 520, and current source 530 form a first stage; transistor 550 and current source 540 form a second stage; and current source 560 and transistor 570 form an output stage. The second stage is coupled to the first stage as part of a feedback loop in a unity gain configuration, and the output stage is coupled to provide an open loop output response.

Flash cell 510 is an example of a floating gate transistor having a variable threshold voltage ($V_T$). The threshold voltage of flash cell 510 may be modified by changing the amount of charge stored on the floating gate of flash cell 510. This may also be referred to as "programming" flash cell 510. Flash cell 510 may be programmed with programming circuitry (not shown) useful for programming floating gate transistors.

As used herein, the term "threshold voltage current" refers to the current that flows through a transistor when a voltage of substantially the threshold voltage appears across the control terminals of the transistor, and the drain voltage is set to a nominal value. For example, the threshold voltage current of an NMOS transistor is equal to the drain-to-source current of the transistor when the gate-to-source voltage is substantially the threshold voltage. Also for example, the threshold voltage current ($I_{VT}$) of flash cell 510 flows from drain 512 to source 514 when the gate-to-source voltage between nodes 516 and 514 is substantially the threshold voltage.

Transistor 520 is coupled between current source 530 and flash cell 510 in a cascode configuration. The gate node of transistor 520 is coupled to node 522 which has a voltage of $V_{CASC}$. $V_{CASC}$ is a voltage that is chosen to provide a suitable drain voltage on drain node 512 of flash cell 510. For example, in some embodiments, $V_{CASC}$ is chosen to provide a drain voltage of between about 0.7 volts and 1.2 volts. In some embodiments, $V_{CASC}$ is set once and is static thereafter. For example, $V_{CASC}$ may be provided by an on-chip voltage reference that remains static. In other embodiments, $V_{CASC}$ may be provided by a variable voltage reference circuit, so that the drain voltage on flash cell 510 may be modified.

The gate node of transistor 550 is coupled to the drain node of transistor 520 to receive a voltage that is influenced by flash cell 510. The drain node of transistor 550 is coupled to a power supply node (which may be "ground"), and the source node of transistor 550 is coupled to provide the feedback voltage $V_{INTREF}$ on node 554. In some embodiments, transistor 550 is operated in the sub-threshold region where the transconductance ($g_m$) of the transistor is proportional to the drain current. This operation is in contrast to operation in the inversion saturation region where $g_m$ is proportional to the square-root of the drain current. In other words, in the sub-threshold region of operation, the value of $g_m$ is higher for a given drain current. The output impedance of the source follower stage is equal to $1/g_m$ of transistor 550, and may be adjusted by choosing the size of source follower transistor 550 and the drain current provided by current source 540.

Current source 530 provides a current $I_{VT}$ substantially equal to the threshold voltage current of flash cell 510. The operation of the feedback loop in combination with current sourced by current source 530 forces the gate-to-source voltage of flash cell 510 to be substantially $V_T$, which may vary based on how flash cell 510 has been programmed. The output voltage $V_{REF}$ is provided by the voltage on gate node 516, which is substantially equal to $V_T$. By programming flash cell 510 to have a different $V_T$, $V_{REF}$ may be modified.

Transistor 570 is a P-channel transistor coupled as a source-follower. P-channel source-followers may be advantageously used to pull down the output node much faster when the initial voltage is higher than the nominal voltage. With the gate voltage fixed, the initial source-to-gate voltage of the source follower transistor will be higher than its nominal value and it can pull down the output voltage very strongly to the nominal value.

In some embodiments, current sources 540 and 560 are designed to source the same current value. Also in some embodiments, transistors 550 and 570 are matched devices that exhibit substantially the same operating characteristics. In embodiments represented by FIG. 5, transistors 550 and 570 are driven by a common gate voltage. In these embodiments, if transistors 550 and 570 are matched, and the two load currents provided by current sources 540 and 560 are matched, the output voltage $V_{REF}$ will be substantially equal to internal loop voltage $V_{INTREF}$ on node 554, which is in turn substantially equal to the threshold voltage $V_T$ of flash cell 510. With the gate voltage of transistor 570 held fixed by the closed loop configuration, transistor 570 may respond very fast and may be able to pull down any voltage on output node 552 to the $V_{REF}$ voltage value without disrupting the operation of the feedback loop.

Figure 5:
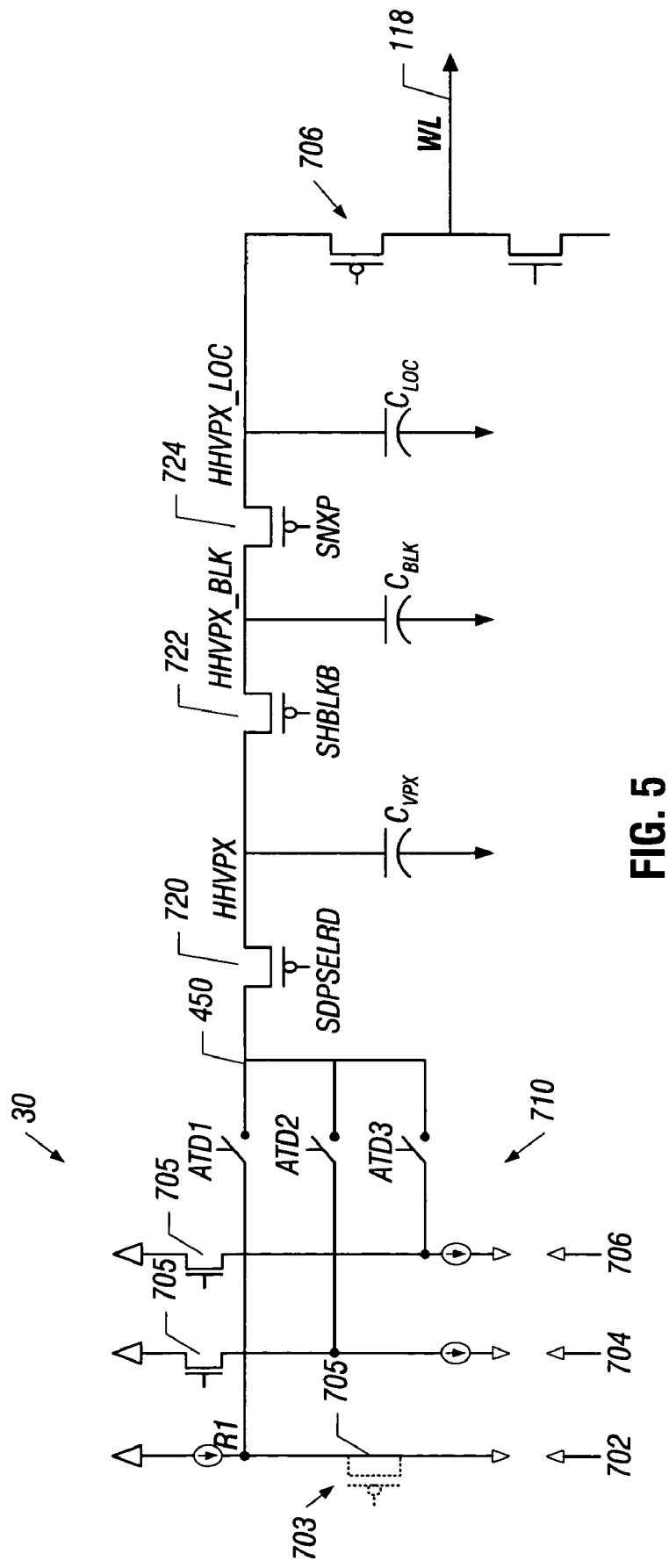
FIG. 5 shows voltage reference circuits coupled to a wordline.

FIG. 5 shows a voltage reference circuit coupled to a wordline 118. Circuits 702, 704, and 706 represent an output circuit of a voltage reference circuit such as voltage reference circuit 500 (FIG. 4). Switches 710 correspond to multiplexer 138, and selectively couple the voltage reference circuits to node 450. Node 450 is an intermediate node that functions as the power supply node for the x-decoder output buffer shown in FIG. 3. Transistors 720, 722, and 724 are p-channel transistors. When the SNXP signal is low, the wordline is selected and is coupled to node 450. When SDPELRD and SHBLKB are low, the wordline 118 is selected.

The p-devices 720, 722, and 724 reduce the capacitance of all the wordline select device differences. SHBLKB and SNXP are low when the plane to which they are coupled is selected and, otherwise, these signals are high.

Voltage reference circuit output stage 702 omits a p-channel transistor 703 that could have been used to efficiently pull down the voltage on node 450 quickly. Voltage reference circuit output stages 704 and 706 include n-channel transistors 705 to efficiently pull up the voltage on node 450 quickly. In some embodiments, the transistor 703 may be omitted, as indicated by dashed lines and the line 705. Eliminating the devices to ground HHVPX and HHVPX-BLK, leave HHVPX and HHVPX-BLK floating when they are not accessed. Floating these nodes is not an issue since they lean towards the high capacitance node voltage through various diffusion leakages.

A stepped voltage waveform may be produced on the wordline by controlling switches 710 and transistor 720. Signals ATD<1:3> may be closed in sequence to provide a stepped voltage waveform on node 450, and when transistor 720 is turned on, the voltage on node 450 is coupled to the wordline. The operation of the circuits shown in FIG. 5 is described with reference to FIGS. 6 and 7.

Figure 3A:
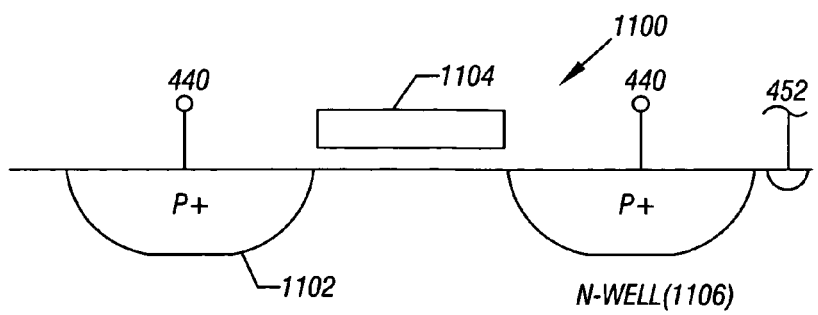
FIG. 3A shows an enlarged cross-section of the p-devices on HHPVX and HHPVX-block.

Referring to FIGS. 3 and 3A, a stable DC signal 452 is applied to the n-wells 1106 of the P-devices 1100 (SHBLKB, SNXP, and SDPSELRD), having a gate 1104 and source and drain 1102. The signal 452 is developed in the voltage generator 130. It is always asserted in selected and deselected planes although it may be at different levels during read, program, or erase. The signal 452 reduces capacitance in the path to allow faster wordline transitions. The signal 452 may remain a higher voltage than any of the reference voltages connected to the wordline during high speed switching.

A system of distributed voltage generators 130 may be used to reduce the effects of wordline capacitance. Each partition may have its own voltage generator 130. The Vpx level voltage generator 130 is closer to the wordline it drives, reducing the routing capacitance on HHVPX.

Figure 6:
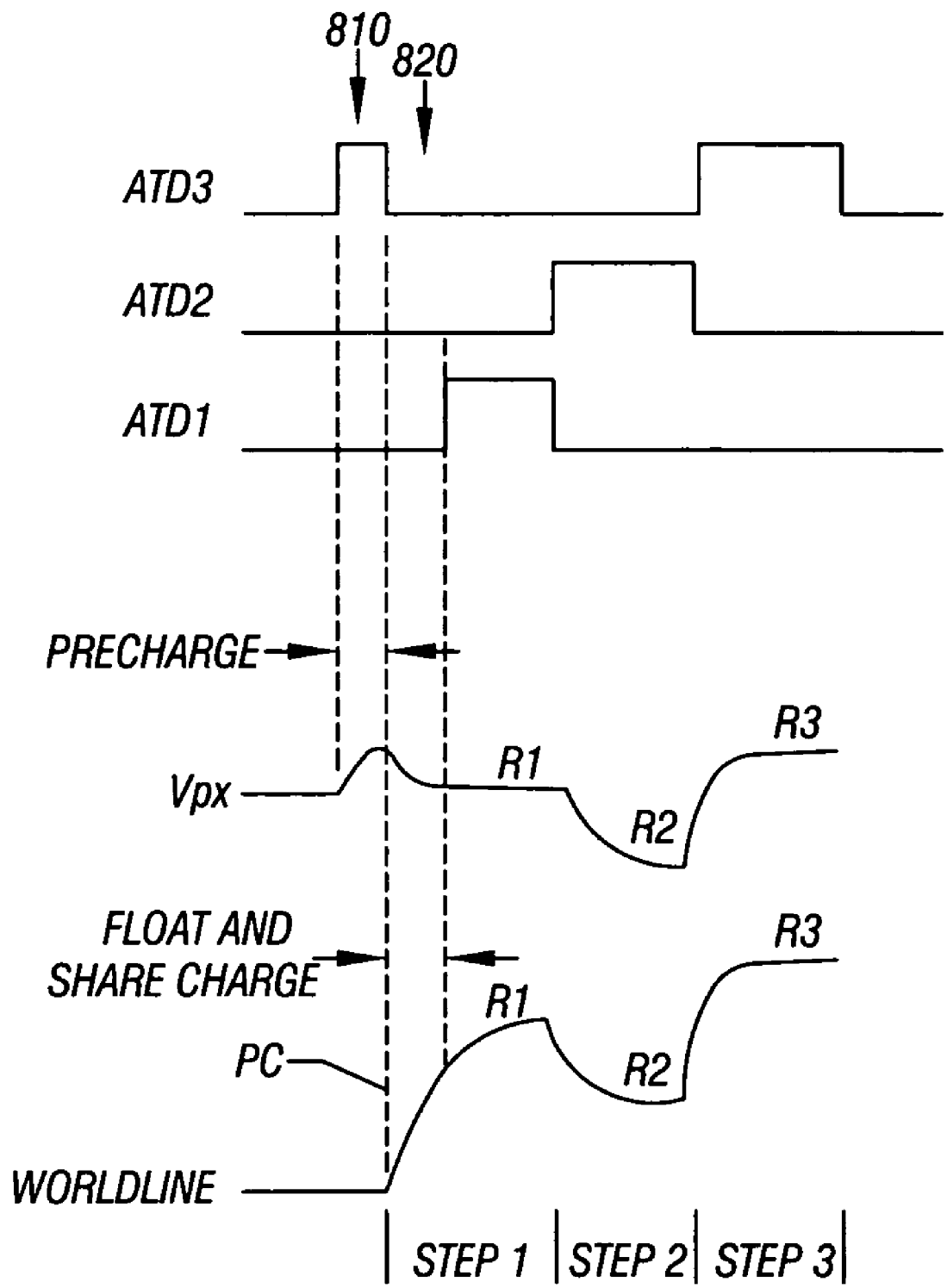
FIG. 6 shows waveforms corresponding to the operation of the circuits of FIG. 5.

FIG. 6 shows waveforms corresponding to the operation of the circuits of FIG. 5. As shown in FIG. 6, Vpx on node 450 steps down in voltage from R1 to R2, and then steps up to R3. During Step 1, Vpx (and the wordline) settle to R1; during Step 2, they settle to R2; and during Step 3, they settle to R3. At or near each step, sensing of multi-level cells can occur as described with respect to previous figures.

FIG. 6 also shows Vpx being pre-charged to R3 prior to being coupled to the wordline. At 810, ATD3 is asserted to pre-charge Vpx, and at 820, node 450 is allowed to electrically float. Also at 820, node 450 is coupled to the wordline to allow charge sharing between the capacitance on node 450 (Cvpx) and the capacitance on the wordline ($C_{BLK}$, $C_{LOC}$). As a result of the charge sharing, the wordline is pulled up in voltage as the pre-charged Vpx drops in voltage.

In some embodiments, the voltage levels, capacitance values, and timing are adjusted to allow the wordline to approach R1 from a higher voltage. For example, as shown in FIG. 6, the charge sharing operation at 820 brings the wordline voltage above R1 prior to ATD1 being asserted. When ATD1 is asserted, the voltage reference circuit that sources R2 will pull the wordline down to R2 from a higher voltage rather than pulling the wordline up to R2 from a lower voltage.

During Step 2, ATD2 is asserted to source R1 onto the wordline, and during Step 3, ATD3 is asserted to source R3 onto the wordline. In some embodiments, the voltage reference circuits that source R2 and R3 have output stages similar to output stages 704 and 706 (FIG. 5). Output stages 704 and 706 are efficient at pulling up, in part because the n-channel transistor is coupled to source current from a higher potential.

Figure 7:
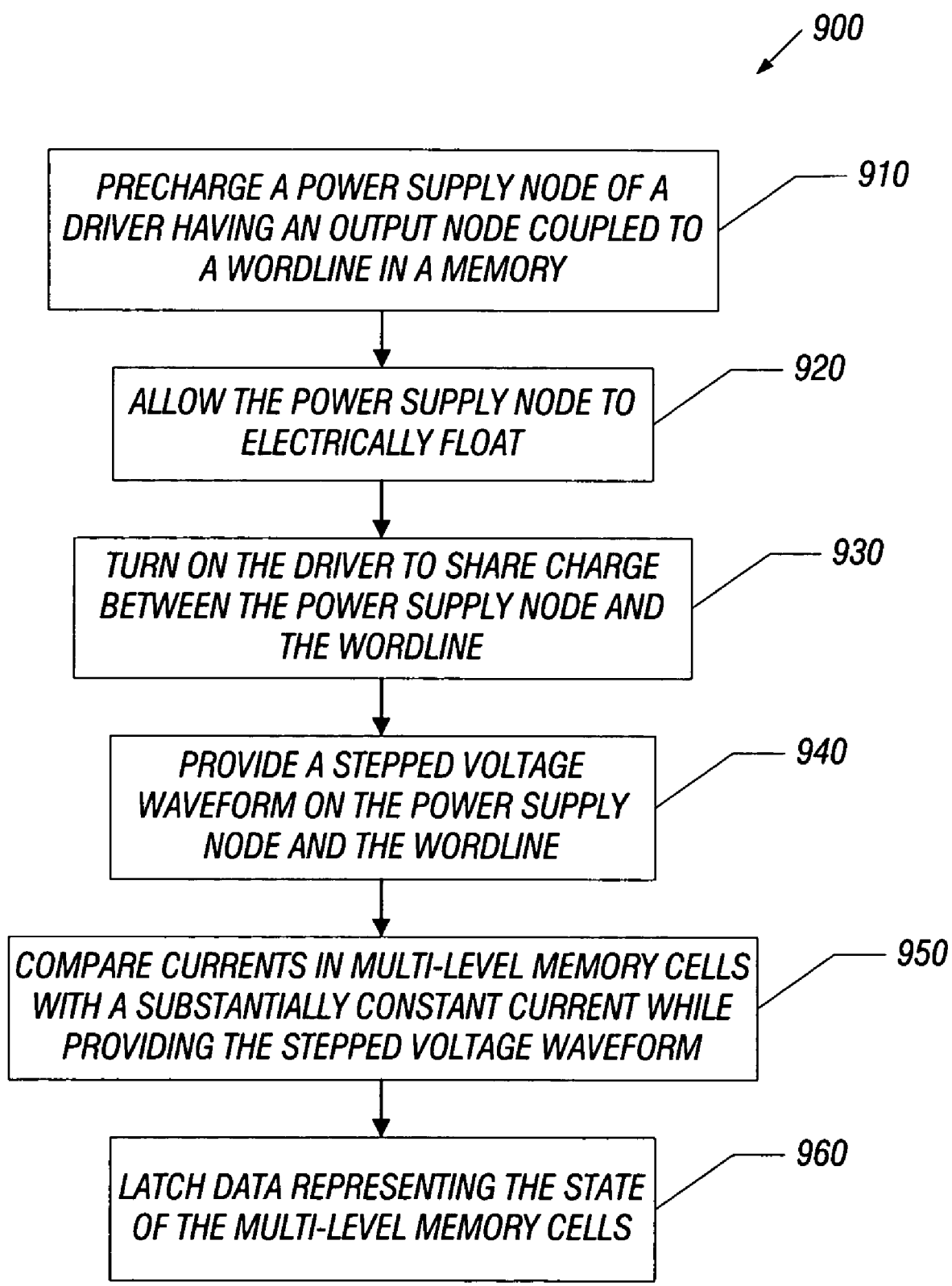
FIG. 7 shows a flowchart in accordance with various embodiments of the present invention.

FIG. 7 shows a flowchart in accordance with various embodiments of the present invention. In some embodiments, method 900, or portions thereof, is performed by a memory device. In other embodiments, method 900 is performed by a control circuit, an integrated circuit, or an electronic system. Method 900 is not limited by the particular type of apparatus or software performing the method. The various actions in method 900 may be performed in the order presented, or may be performed in a different order. Further, in some embodiments, some actions listed in FIG. 7 are omitted from method 900.

Method 900 is shown beginning with block 910 in which a power supply node of a driver having an output node coupled to a wordline in a memory is pre-charged. In some embodiments, this corresponds to an x-decoder power supply node being pre-charged. For example, as shown in FIG. 3, an x-decoder may have multiple power supply nodes, where at least one is used to provide a power supply voltage to an output buffer coupled to a wordline. The power supply node may be pre-charged to a voltage value corresponding to a wordline voltage used for a read operation, or the power supply node may be pre-charged to a different voltage.

At 920, the power supply node is allowed to electrically float. In some embodiments, this corresponds to decoupling the power supply node from any circuit used for the pre-charge operation of 910. At 930, the driver is turned on to share charge between the power supply node and the wordline.

Figure 8:
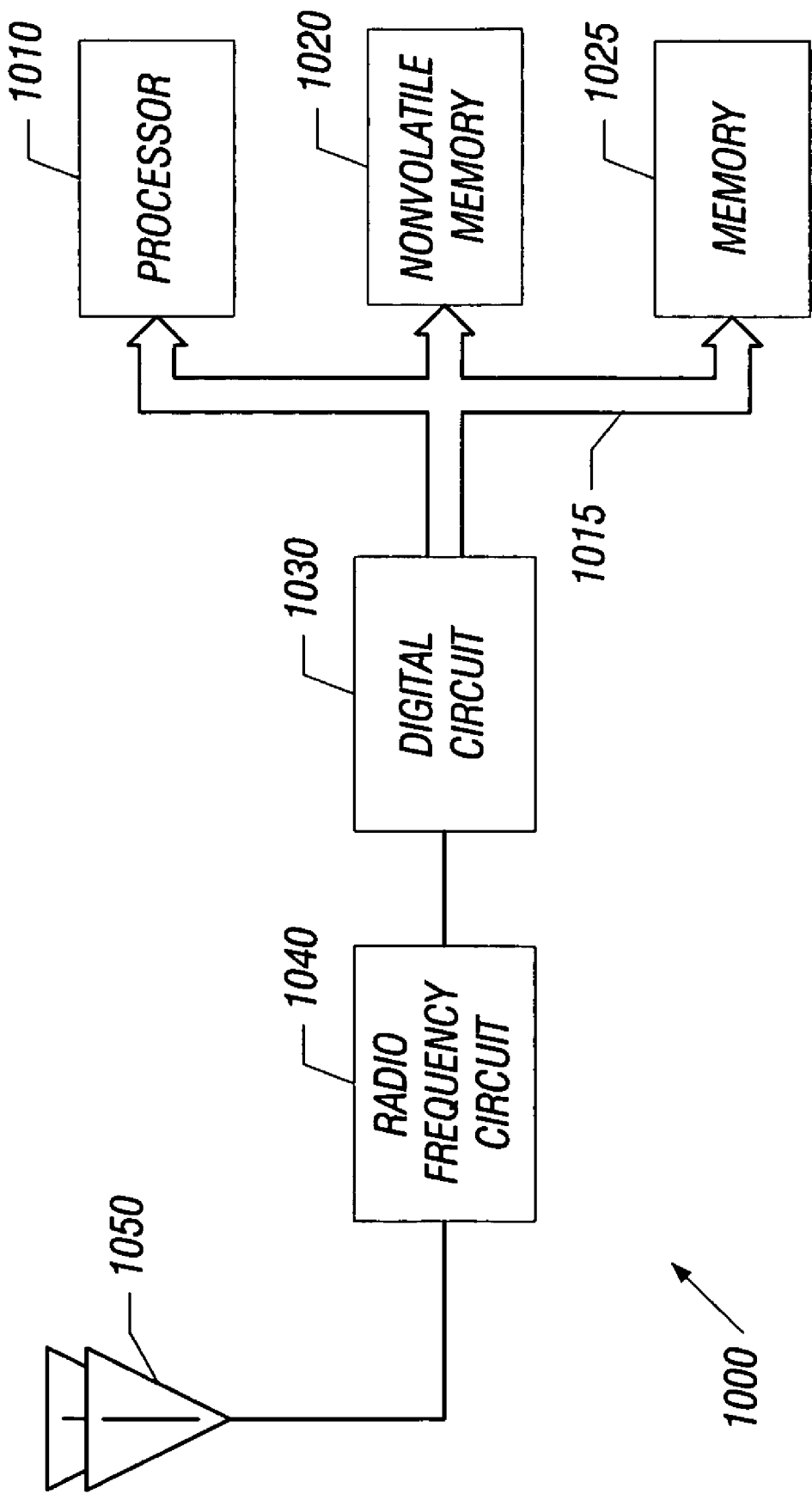
FIG. 8 shows an electronic system in accordance with various embodiments of the present invention.

FIG. 8 shows an electronic system in accordance with various embodiments of the present invention. Electronic system 1000 includes processor 1010, nonvolatile memory 1020, memory 1025, digital circuit 1030, radio frequency (RF) circuit 1040, and antennas 1050. Processor 1010 may be any type of processor adapted to access nonvolatile memory 1020 and memory 1025. For example, processor 1010 may be a microprocessor, a digital signal processor, a microcontroller, or the like.

Example systems represented by FIG. 8 include cellular phones, personal digital assistants, wireless local area network interfaces, or any other suitable system. Nonvolatile memory 1020 may be adapted to hold information for system 1000. For example, nonvolatile memory 1020 may hold device configuration data, such as contact information with phone numbers, or settings for digital circuit 1030 or RF circuit 1040. Further, nonvolatile memory 1020 may hold multimedia files such as photographs or music files. Still further, nonvolatile memory 1020 may hold program code to be executed by processor 1010. Nonvolatile memory 1020 may be any of the memory embodiments described herein, including memory device 100 (FIG. 1). Many other systems uses for nonvolatile memory 1020 exist. For example, nonvolatile memory 1020 may be used in a desktop computer, a network bridge or router, or any other system without an antenna.

Radio frequency circuit 1040 communicates with antennas 1050 and digital circuit 1030. In some embodiments, RF circuit 1040 includes a physical interface (PHY) corresponding to a communications protocol. For example, RF circuit 1040 may include modulators, demodulators, mixers, frequency synthesizers, low noise amplifiers, power amplifiers, and the like. In some embodiments, RF circuit 1040 may include a heterodyne receiver, and in other embodiments, RF circuit 1040 may include a direct conversion receiver. In some embodiments, RF circuit 1040 may include multiple receivers. For example, in embodiments with multiple antennas 1050, each antenna may be coupled to a corresponding receiver. In operation, RF circuit 1040 receives communications signals from antennas 1050, and provides signals to digital circuit 1030. Further, digital circuit 1030 may provide signals to RF circuit 1040, which operates on the signals and then transmits them to antennas 1050.

Digital circuit 1030 is coupled to communicate with processor 1010 and RF circuit 1040. In some embodiments, digital circuit 1030 includes circuitry to perform error detection/correction, interleaving, coding/decoding, or the like. Also in some embodiments, digital circuit 1030 may implement all or a portion of a media access control (MAC) layer of a communications protocol. In some embodiments, a MAC layer implementation may be distributed between processor 1010 and digital circuit 1030.

Radio frequency circuit 1040 may be adapted to receive and demodulate signals of various formats and at various frequencies. For example, RF circuit 1040 may be adapted to receive time domain multiple access (TDMA) signals, code domain multiple access (CDMA) signals, global system for mobile communications (GSM) signals, orthogonal frequency division multiplexing (OFDM) signals, multiple-input-multiple-output (MIMO) signals, spatial-division multiple access (SDMA) signals, or any other type of communications signals. The present invention is not limited in this regard.

Antennas 1050 may include one or more antennas. For example, antennas 1050 may include a single directional antenna or an omni-directional antenna. As used herein, the term omni-directional antenna refers to any antenna having a substantially uniform pattern in at least one plane. For example, in some embodiments, antennas 1050 may include a single omni-directional antenna such as a dipole antenna, or a quarter wave antenna. Also for example, in some embodiments, antennas 1050 may include a single directional antenna such as a parabolic dish antenna or a Yagi antenna. In still further embodiments, antennas 1050 may include multiple physical antennas. For example, in some embodiments, multiple antennas are utilized to support multiple-input-multiple-output (MIMO) processing or spatial-division multiple access (SDMA) processing.

Memory 1025 represents an article that includes a machine readable medium. For example, memory 1025 represents a random access memory (RAM), dynamic random access memory (DRAM), static random access memory (SRAM), read only memory (ROM), flash memory, or any other type of article that includes a medium readable by processor 1010. Memory 1025 may store instructions for performing the execution of the various method embodiments of the present invention.

In operation, processor 1010 reads instructions and data from either or both of nonvolatile memory 1020 and memory 1025 and performs actions in response thereto. For example, processor 1010 may access instructions from memory 1025 and program threshold voltages within reference voltage generators and reference current generators inside nonvolatile memory 1020. In some embodiments, nonvolatile memory 1020 and memory 1025 are combined into a single memory device. For example, nonvolatile memory 1020 and memory 1025 may both be included in a single nonvolatile memory device.

Although the various elements of system 1000 are shown separate in FIG. 8, embodiments exist that combine the circuitry of processor 1010, nonvolatile memory 1020, memory 1025 and digital circuit 1030 in a single integrated circuit. For example, memory 1025 or nonvolatile memory 1020 may be an internal memory within processor 1010 or may be a microprogram control store within processor 1010. In some embodiments, the various elements of system 1000 may be separately packaged and mounted on a common circuit board. In other embodiments, the various elements are separate integrated circuit dice packaged together, such as in a multi-chip module, and in still further embodiments, various elements are on the same integrated circuit die.

The type of interconnection between processor 1010 and nonvolatile memory 1020 is not a limitation of the present invention. For example, bus 1015 may be a serial interface, a test interface, a parallel interface, or any other type of interface capable of transferring command and status information between processor 1010, nonvolatile memory 1020, and memory 1025.

Step voltage generators, voltage references, flash cells, feedback circuits, x-decoders, control circuits, and other embodiments of the present invention can be implemented in many ways. In some embodiments, they are implemented in integrated circuits. In some embodiments, design descriptions of the various embodiments of the present invention are included in libraries that enable designers to include them in custom or semi-custom designs. For example, any of the disclosed embodiments can be implemented in a synthesizable hardware design language, such as VHDL or Verilog, and distributed to designers for inclusion in standard cell designs, gate arrays, or the like. Likewise, any embodiment of the present invention can also be represented as a hard macro targeted to a specific manufacturing process. For example, memory array 110 (FIG. 1) can be represented as polygons assigned to layers of an integrated circuit.

References throughout this specification to "one embodiment" or "an embodiment" mean that a particular feature, structure, or characteristic described in connection with the embodiment is included in at least one implementation encompassed within the present invention. Thus, appearances of the phrase "one embodiment" or "in an embodiment" are not necessarily referring to the same embodiment. Furthermore, the particular features, structures, or characteristics may be instituted in other suitable forms other than the particular embodiment illustrated and all such forms may be encompassed within the claims of the present application.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
    generating at least three selectable wordline voltages for a wordline path of multi-level memory;
    supplying said voltages through at least two switched transistors along the wordline path; and
    sensing an intermediate wordline voltage level of said at least three selectable wordline voltages, then sensing the lower of said three selectable wordline voltages and then sensing the higher of said three wordline voltages.

2. The method of claim 1 including forming said switched transistors of p-type transistors.

3. The method of claim 2 including providing a stable DC bias potential to the n-wells of said p-type transistors.

4. The method of claim 3 including providing a stable DC bias potential that is always asserted in selected in deselected memory planes.

5. The method of claim 1 including allowing the wordline path to float when the wordline path is not accessed.

6. The method of claim 1 including providing one generator to generate said three selectable wordline voltages for each of a plurality of partitions.

7. The method of claim 1 including pre-charging said wordline path to the higher of said three voltages.

8. The method of claim 1 including generating voltages for a multi-level flash memory.

9. The method of claim 1 including generating voltages for a multi-level flash memory having four different levels.

10. A multi-level memory comprising:
    a plurality of multi-level memory cells along a wordline;
    a wordline decoder to generate at least three selectable wordline voltages for said wordline, said decoder including a wordline voltage generator to first sense an intermediate wordline voltage level of said at least three selectable wordline voltages, then sense the lower of said three selectable wordline voltages, and then sense the higher of said three wordline voltages; and
    at least two switched transistors along said wordline.

11. The memory of claim 10 wherein said memory is a flash memory.

12. The memory of claim 10 wherein said transistors are p-type transistors.

13. The memory of claim 12 wherein said p-type transistors are supplied with a stable DC bias voltage on their n-wells.

14. The memory of claim 13 wherein said stable DC bias voltage is asserted in selected and deselected memory planes.

15. The memory of claim 10 wherein said wordline path floats when the wordline is not accessed.

16. The memory of claim 10 including at least one partition and a generator to generate three selectable wordline voltages for each partition.

17. The memory of claim 10 wherein said wordline decoder to pre-charge the wordline to the higher of said three selectable voltages.

18. The memory of claim 10 wherein said memory is a multi-level flash memory having four memory levels.

19. A system comprising:
    a processor;
    a wireless interface coupled to said processor; and
    a multi-level memory coupled to said processor including a plurality of multi-level memory cells along a wordline, a wordline decoder to generate at least three selectable wordline voltages for said wordline, and at least two switched transistors along said wordline, wherein said wordline path floats when the wordline is not accessed.

20. The system of claim 19 wherein said memory is a flash memory.

21. The system of claim 19 wherein said memory is a multi-level flash memory having four memory levels.

22. The system of claim 19 wherein said transistors are p-type transistors.

23. The system of claim 22 wherein said p-type transistors are supplied with a stable DC bias voltage on their n-wells.

* * * * *